(12) United States Patent
Park

(10) Patent No.: US 7,417,863 B2
(45) Date of Patent: Aug. 26, 2008

(54) COOLING DEVICE FOR FOLDER TYPE PORTABLE WIRELESS TERMINAL

(75) Inventor: Jong-Hoon Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 190 days.

(21) Appl. No.: 11/302,849

(22) Filed: Dec. 14, 2005

(65) Prior Publication Data

US 2006/0126299 A1   Jun. 15, 2006

(30) Foreign Application Priority Data

Dec. 14, 2004   (KR) ..................... 10-2004-0105663

(51) Int. Cl.
*H05K 7/20* (2006.01)
(52) U.S. Cl. .................. 361/719; 361/687; 361/690; 165/80.2; 165/80.3
(58) Field of Classification Search ................. None
See application file for complete search history.

(56) References Cited

U.S. PATENT DOCUMENTS

| | | | | |
|---|---|---|---|---|
| 5,588,483 A * | 12/1996 | Ishida | .................. | 165/86 |
| 5,661,637 A * | 8/1997 | Villaume | .................. | 361/687 |
| 5,872,699 A * | 2/1999 | Nishii et al. | .................. | 361/699 |
| 5,880,929 A * | 3/1999 | Bhatia | .................. | 361/687 |
| 5,910,883 A * | 6/1999 | Cipolla et al. | .................. | 361/687 |
| 6,069,791 A * | 5/2000 | Goto et al. | .................. | 361/687 |
| 6,097,596 A * | 8/2000 | Cipolla et al. | .................. | 361/687 |
| 6,347,035 B1 * | 2/2002 | Hamano et al. | .................. | 361/687 |
| 6,839,231 B2 * | 1/2005 | Fleck et al. | .................. | 361/687 |
| 6,982,874 B2 * | 1/2006 | Smalc et al. | .................. | 361/704 |
| 7,113,399 B2 * | 9/2006 | Hisano et al. | .................. | 361/688 |
| 2005/0168941 A1 * | 8/2005 | Sokol et al. | .................. | 361/688 |

FOREIGN PATENT DOCUMENTS

| | | |
|---|---|---|
| KR | 10-2004-0039841 | 5/2004 |
| KR | 1020040056620 | 7/2004 |
| KR | 1020050005986 | 1/2005 |
| KR | 1020050007679 | 1/2005 |

* cited by examiner

*Primary Examiner*—Boris L Chervinsky
(74) *Attorney, Agent, or Firm*—The Farrell Law Firm, PC

(57) ABSTRACT

Disclosed is a cooling device for a folder type portable wireless terminal including a main body and an openable folder coupled with the main body. In the cooling device, a cooling plate is installed in the folder with a predetermined size, and a heat transfer element has one end connected to the cooling plate and the other end connected to a predetermined portion of a mainboard of the main body to transfer heat generated from the mainboard to the cooling plate.

19 Claims, 7 Drawing Sheets

COOLING DEVICE FOR FOLDER TYPE PORTABLE WIRELESS TERMINAL

PRIORITY

This application claims priority under 35 U.S.C. § 119 to an application entitled "Cooling Device for Folder Type Portable Wireless Terminal" filed in the Korean Intellectual Property Office on Dec. 14, 2004 and assigned Serial No. 2004-105663, the contents of which are incorporated herein by reference.

BACKGROUND OF THE INVENTION

1. Field of the Invention

The present invention relates to a cooling device for a folder type portable wireless terminal, and more particularly, to a cooling device for a folder type portable wireless terminal that dissipates heat generated by the components in the terminal.

2. Background of the Prior Art

With the rapid development of the electronics and communications industry, portable wireless terminals such as cellular phones, personal digital assistants (PDA) and wireless notebook computers are being widely used all over the world. Recent portable wireless terminals provide convenient and various functions as well as the typical communications function. For this reason, the main circuit board, or mainboard, that houses the internal electrical components of the portable wireless terminal includes an increasing number of components.

To accommodate the increasing number of components, they are reduced in size while increasing functionality and capability, which, in turn, increases their complexity. These small-sized, complexly-interconnected components are mounted onto the mainboard for integration. However, the resulting complex mainboard produces much more heat. For example, high-performance components, such as a modem, a multimedia chip, and a Power Amplifier Module (PAM) for a Code Division Multiple Access (CDMA) terminal, are known as excessive heat generating components of the mainboard.

Since the conventional portable wireless terminal does not have a cooling means or has a cooling means only within its main body, long-time operation of the portable wireless terminal builds up heat inside the main body and increases the temperatures of case frame, mainboard and the main body, such that the portable wireless terminal may operate improperly. In addition, the temperature increase may cause discomfort for the terminal user. Therefore, there is a need for a cooling device capable of dissipating the heat of portable wireless terminals.

SUMMARY OF THE INVENTION

The present invention provides a cooling device for a folder type portable wireless terminal, the cooling device being designed to effectively dissipate heat generated at a mainboard.

Also, the present invention provides a cooling device for a folder type portable wireless terminal, the cooling device being capable of effectively dissipating heat generated from a mainboard of a main body to a folder to allow long-time operation of the terminal without overheating and malfunction.

Further, the present invention provides a cooling device for a folder type portable wireless terminal, the cooling device being capable of effectively transferring heat generated at a specific portion of the terminal toward an entire area of the terminal to rapidly dissipate the heat to allow long-time operation of the terminal without overheating and causing discomfort to the user.

According to an aspect of the present invention, there is provided a cooling device for a folder type portable wireless terminal with a main body and an openable folder coupled with the main body, the cooling device including: a cooling plate installed in the folder with a predetermined size; and a heat transfer element having one end connected to the cooling plate and the other end connected to a predetermined portion of a mainboard of the main body to transfer heat generated from the mainboard to the cooling plate.

According to the cooling device of the present invention, installation of the cooling plate in the folder that is opened when the terminal is operated enables rapid dissipation of heat generated from the main body because the folder in which the cooling plate is installed is opened during the heat transfer.

Further, the heat transfer element is used to connect the cooling plate installed in the folder with the mainboard of the main body. The heat transfer element is preferably made of an electrically non-conductive material with high thermal conductivity.

Furthermore, since the heat transfer element is disposed through a path where a flexible printed circuit (FPC) is disposed to connect the mainboard of the main body with a printed circuit board (PCB) of the folder, the cooling device does not require an additional path to install the heat transfer element.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. A detailed description of well-known features will be omitted for conciseness.

Figure 1:
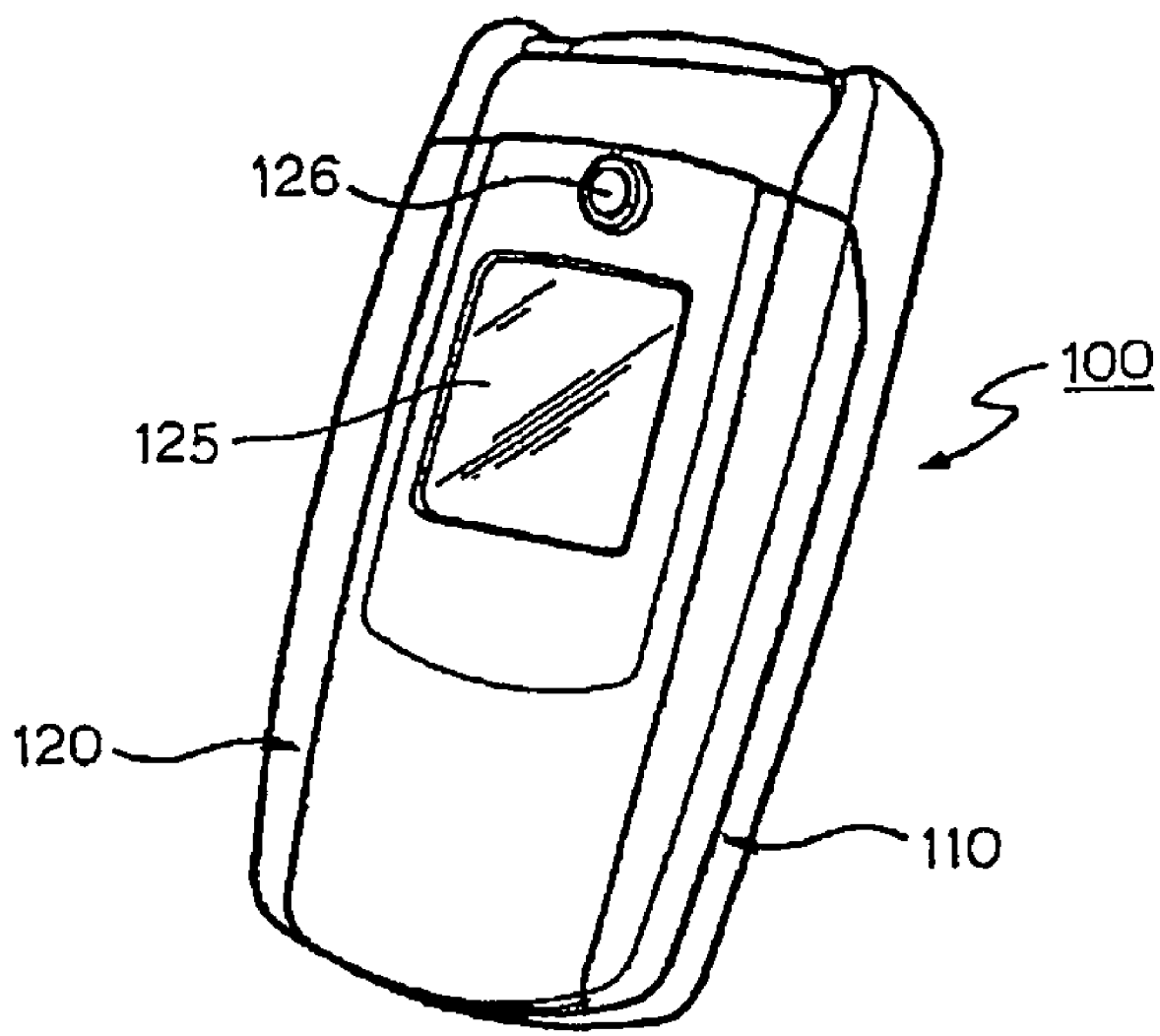
FIG. 1 is a perspective view of a folder type portable wireless terminal according to an embodiment of the present invention.
Figure 2:
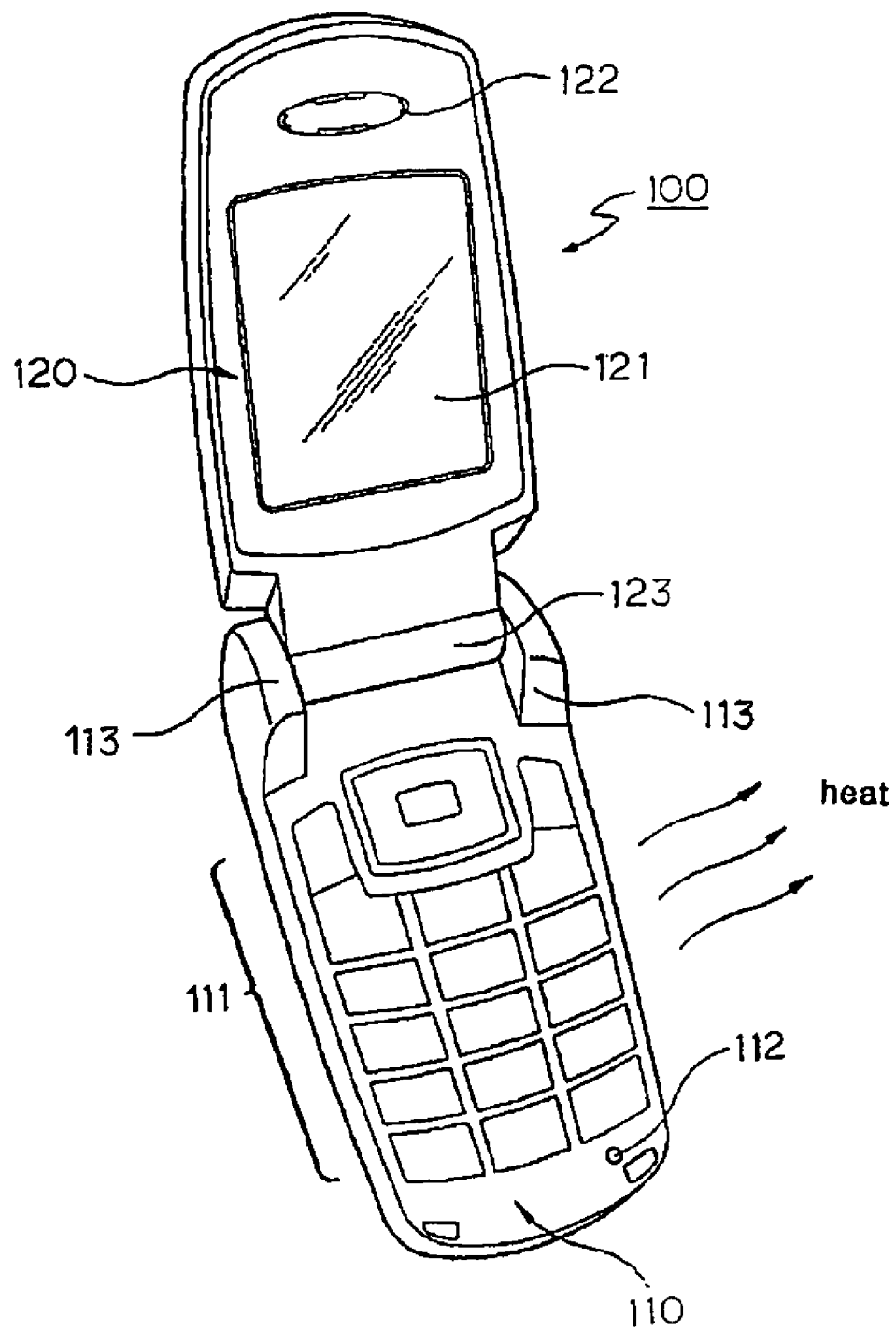
FIG. 2 is a perspective view of the wireless terminal of FIG. 1 in an open configuration.

FIG. 1 is a perspective view of a folder type portable wireless terminal according to an embodiment of the present invention in a closed configuration, and FIG. 2 is a perspective view of the wireless terminal in an open configuration.

Figure 4:
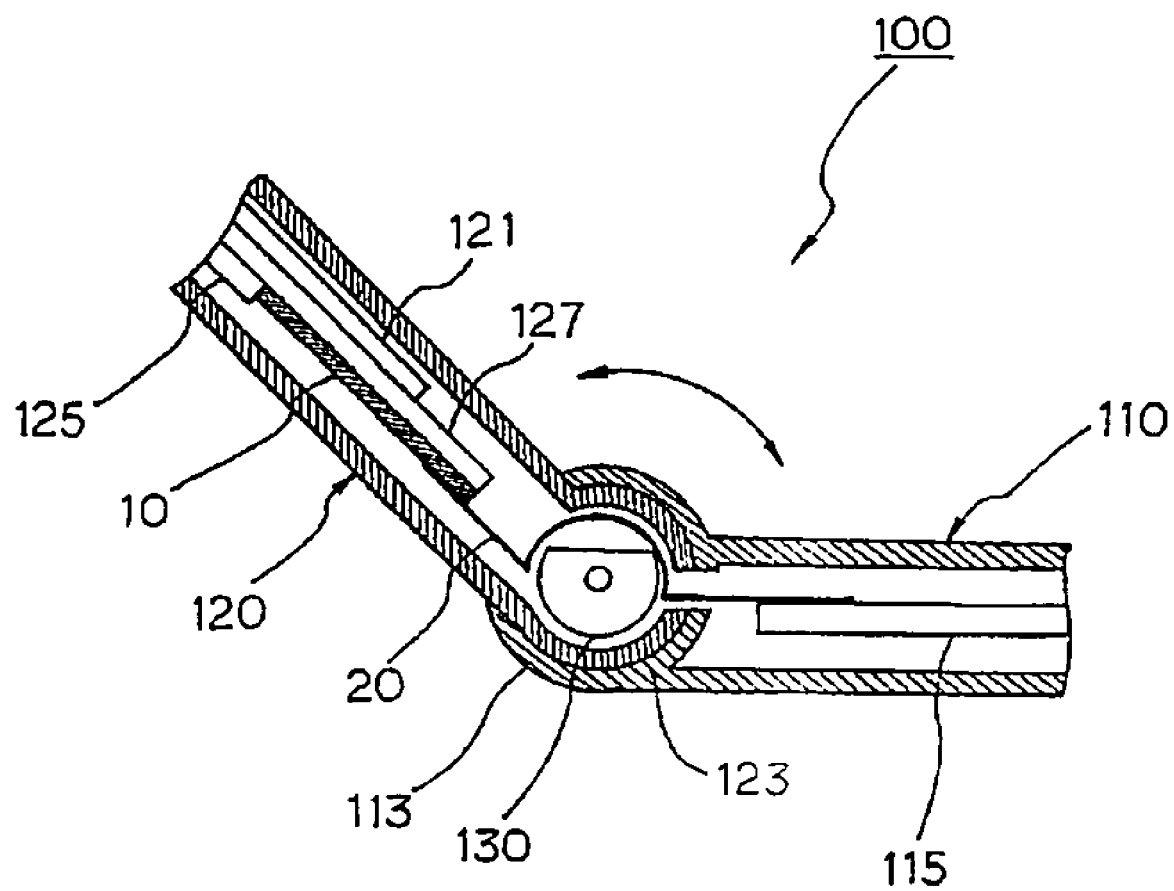
FIG. 4 is a partial sectional view of a folder type portable wireless terminal with a cooling device installed according to an embodiment of the present invention.

Referring to FIGS. 1 and 2, a terminal 100 includes a main body 110, a folder 120 rotatably coupled to the main body 110, and a hinge module 130 (as shown in FIG. 4) enabling the folder 120 to be opened at a predetermined angle range (generally between 130-140°). The hinge module 130 includes a hinge shaft installed in a hinge housing, a hinge cam engaged with the hinge shaft, and a hinge spring biasing the hinge cam against the hinge shaft. The hinge module 130 is accommodated in the hinge housing as an assembly, and the hinge housing is installed in the main body 110 or a boundary portion of the folder 120. Generally, the hinge housing is made of a high-strength metal to increase durability.

In this embodiment, the hinge module is installed in a center hinge arm 123 of the folder 120, and a shaft head protruding from an end of the hinge module is coupled to one of hinge arms 113 formed at both sides of the main body 110, such that the terminal 100 can be opened and closed.

The main body 110 includes a keypad assembly 111 having navigation buttons as a data input device and a microphone 112 under the keypad assembly 111 to receive user's voice. The folder 120 includes a main Liquid Crystal Display (LCD) module 121 as an output device, and an earpiece 122 from which the user can hear voice communications. The main LCD module 121 may be a wide color LCD module. Also, the terminal 100 may include a slave LCD module 125 at an outer surface of the folder 120 and a camera 126 above the slave LCD module 125 for taking pictures.

When a user opens and operates the terminal 100, the main body 110 is heated by heat generated by the components mounted on a mainboard of the main body 110. According to the present invention, the heat is dissipated from the main body 110 to the folder 120, such that the main body 110 can be protected from overheating.

Figure 3:
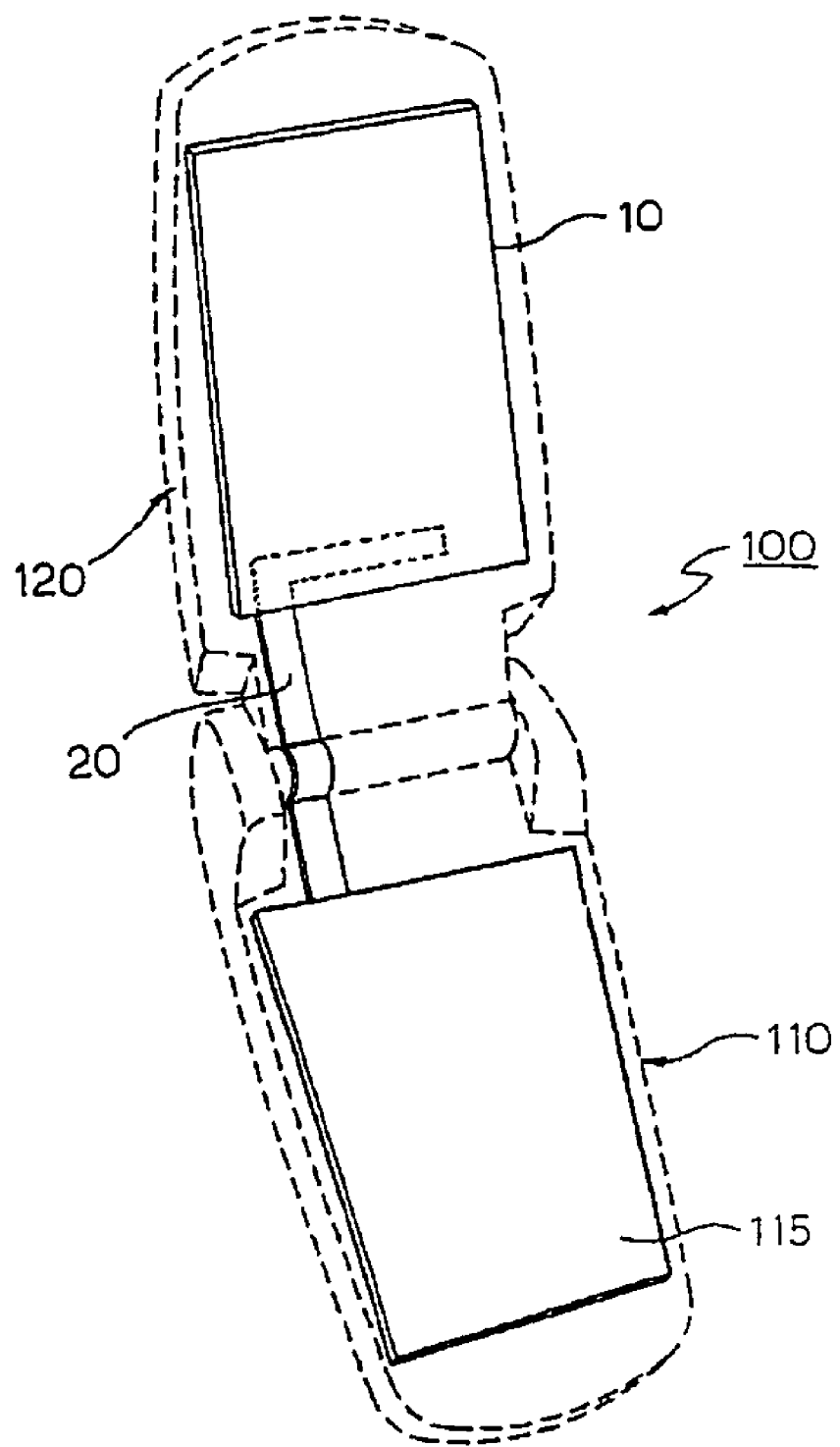
FIG. 3 is a schematic view of a cooling device according to an embodiment of the present invention.

FIG. 3 is a schematic view of a cooling device of a folder type portable wireless terminal according to an embodiment of the present invention.

Referring to FIG. 3, the terminal 100 includes a mainboard 115, a cooling plate 10, and a heat transfer element 20. The mainboard 115 is installed in the interior compartment of the main body 110. The mainboard 115 is mounted with a plurality of components (not shown) for operation of the terminal 100. The cooling plate 10 is installed in the folder 120. The cooling plate 10 is preferably sized as big as possible within the folder 120. The heat transfer element 20 connects the mainboard 115 and the cooling plate 10. That is, the heat transfer element 20 transfers the heat from the mainboard 115 to the cooling plate 10 to dissipate the heat. Therefore, the heat transfer element 20 may be connected to a portion of the mainboard 115 where most of the heat-generating components or component groups are mounted. The heat transfer element 20 is preferably made of an electrically non-conductive material with a high thermal conductivity. Since heat transfer rate increases in proportion to the area of the heat transfer element 20, the heat transfer element 20 may be shaped widely. An electrically non-conductive material with a high thermal conductivity, such as a silicon rubber and a graphite sheet, may have a tape-shape to be used for the heat transfer element 20. Since frequent opening and closing of the folder 120 can damage the heat transfer element 20, the heat transfer element 20 may be coated with an electrically non-conducting film to increase durability. Also, the heat transfer element 20 may be disposed in a path, through which a flexible printed circuit (FPC, not shown) is disposed that connects the main body 110 and the folder 120.

Figure 5:
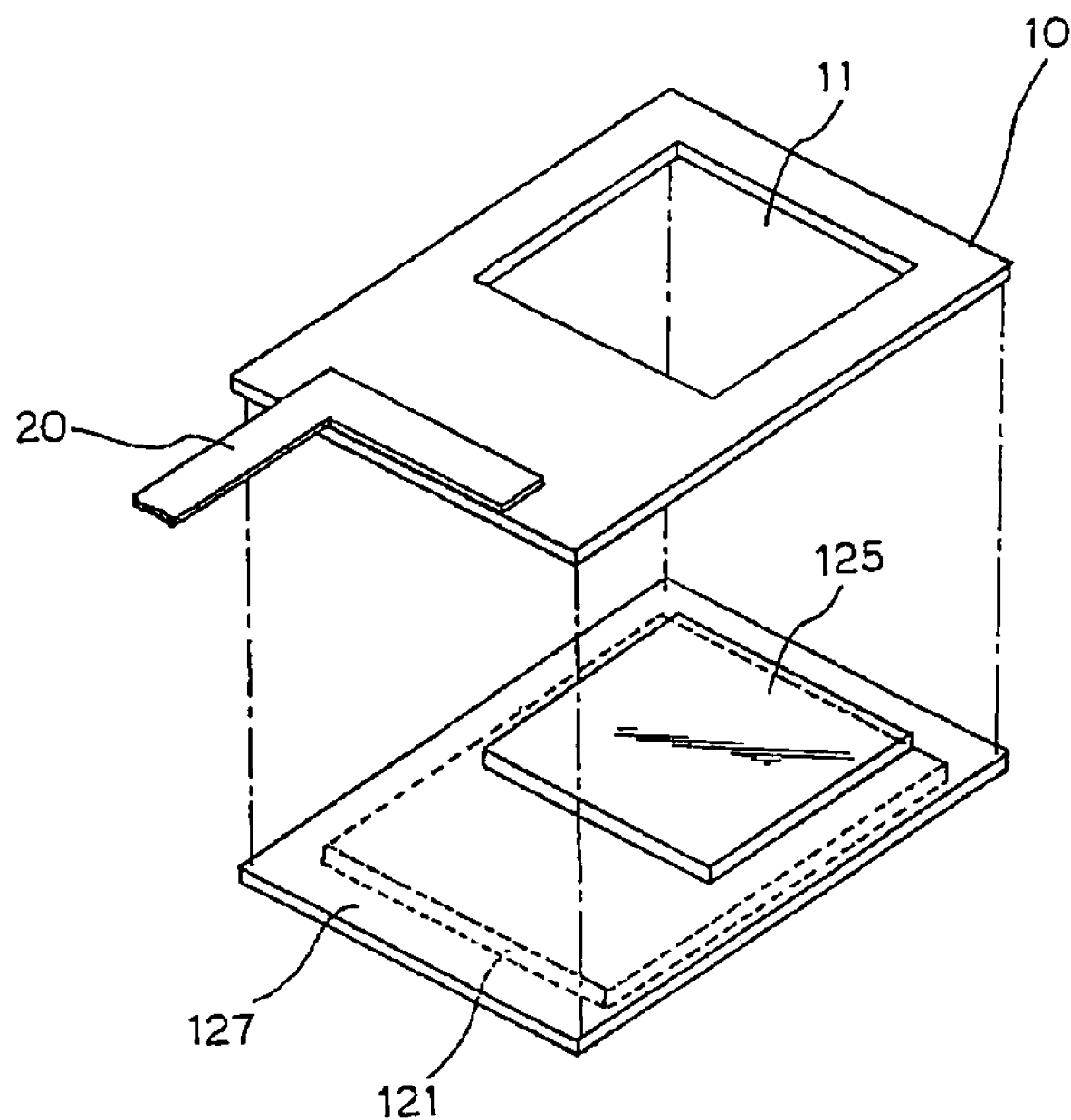
FIG. 5 is a partial perspective view showing an installed structure of a cooling plate in the folder type portable wireless terminal depicted in FIG. 4.

FIG. 4 is a partial sectional view of a folder type portable wireless terminal installed with a cooling device according to the present invention, and FIG. 5 is a partial perspective view showing an installed structure of a cooling plate in the folder type portable wireless terminal depicted in FIG. 4.

Referring to FIGS. 4 and 5, the cooling plate 10 is installed in the folder 120. The folder 120 includes a main LCD module 121 at its front and a slave LCD module 125 at its back. The cooling plate 10 may be installed in the folder 120 without interfering with the slave LCD module 125.

Referring again to FIG. 4, the center hinge arm 123 of the folder 120 is coupled with the side hinge arms 113 of the main body 110. The hinge module 130 is installed in the center hinge arm 123 to facilitate the opening and closing of the folder 120. The folder 120 is provided with a printed circuit board (PCB) 127 on which the main LCD module 121 and the slave LCD module 125 are mounted. The PCB 127 may be made of a dielectric material with a predetermined thickness or made from an FPC board. The PCB 127 has a front surface on which the main LCD module 121 is mounted and a back surface on which the slave LCD 125 module is mounted. Preferably, the cooling plate 10 is installed on the back surface of the PCB 127, such that the cooling plate 10 can be located at an outer position when the folder 120 is opened.

The heat transfer element 20 has one end attached to the cooling plate 10 and the other end attached to the mainboard 115 of the main body 110. Well-known methods such as bonding and hot melt adhesion may be used to attach the heat transfer element 20 to the cooling plate 10. In addition, the manner of attaching the heat transfer element 20 to the cooling plate 10 may be configured to increase the contact surface therebetween. The other end of the heat transfer element 20 may be attached to a portion of the mainboard 115 where the most heat-generating components or component groups are mounted. Alternatively, a pattern may be formed on the mainboard 115 to connect heat-generating components and the heat transfer element 20 may be attached to the pattern.

Referring again to FIG. 5, the cooling plate 10 is shaped such that the slave LCD module 125 can be mounted on the PCB 127 without interfering with the cooling plate 10. That is, the cooling plate 10 defines an opening 11 through which the slave LCD module 125 passes when mounted on the PCB 127.

The cooling plate 10 may be made of a well-known metal with high thermal conductivity. For example, the cooling plate 10 may be made of one of the following materials: magnesium, silver, gold, copper, aluminum, tungsten, combinations and alloys thereof.

Figure 6:
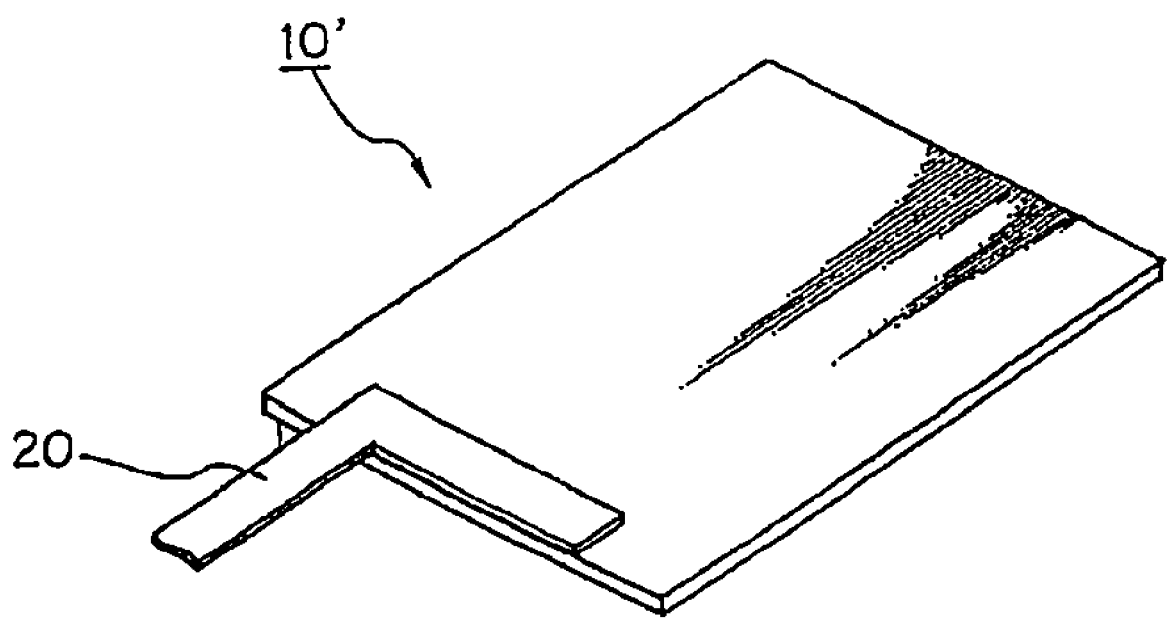
FIG. 6 is a perspective view of a cooling plate according to a alternative embodiment of the present invention.

FIG. 6 is a perspective view of a cooling plate according to an alternative embodiment of the present invention.

Referring to FIG. 6, a cooling plate 10' is designed for a folder type portable wireless terminal that has a main LCD module without a slave LCD module. The cooling plate 10' does not define an opening, unlike the cooling plate 10 shown in FIG. 5. The cooling plate 10' and the main LCD may be mounted on opposing surfaces of the PCB 127, and the cooling plate 10' may entirely cover one surface of the PCB 127.

Figure 7:
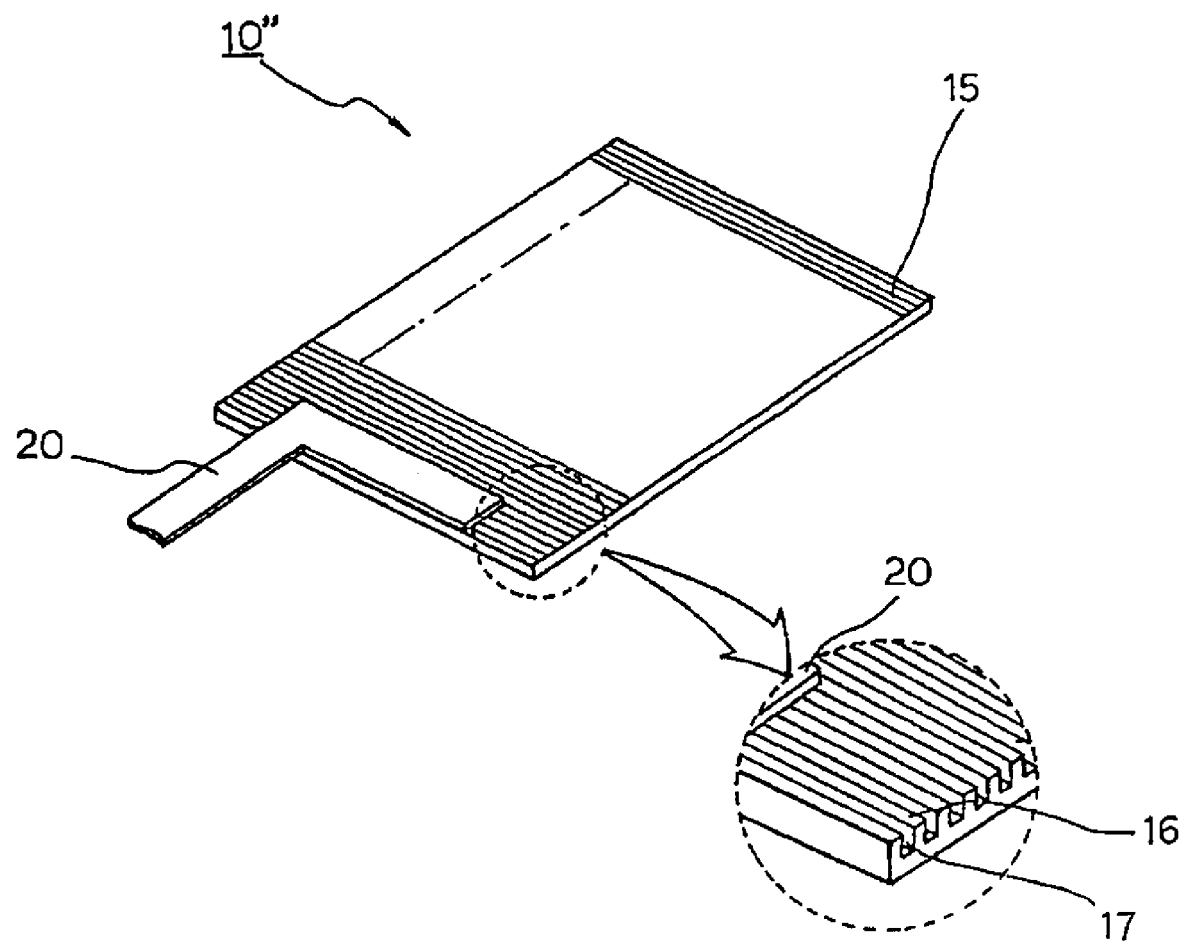
FIG. 7 is a perspective view of a cooling plate according to a further alternative embodiment of the present invention.

FIG. 7 is a perspective view of a cooling plate according to a further alternative embodiment of the present invention.

Referring to FIG. 7, a cooling plate 10" has top surface and bottom surface. The bottom surface comes into contact with the PCB 127 of the folder 120 when the cooling plate 10" is mounted on the PCB 127. The top surface has convex portions 16 and concave portions 17 that are alternately arranged in width direction. The convex and concave portions 16 and 17 may function as cooling fins. To prevent decrease in a contact area between the cooling plate 10" and the heat transfer element 20, the convex and concave portions 16 and 17 are not formed where the heat transfer element 20 is connected. That is, the heat is transferred from the mainboard 115 through the heat transfer element 20 and the contact surface to the cooling plate 10″ where the heat is efficiently dissipated owing to the convex and concave portions 16 and 17. The cooling plate 10″ may function like a well-known heat sink.

Alternatively, the convex and concave portions 16 and 17 may be arranged in a length direction of the cooling plate 10″. Also, various types of well-known heat sink structures may be applied to the convex and concave portions 16 and 17. In addition, a pad with a high thermal conductivity may be disposed between the cooling plate 10″ and the PCB 127.

As described above, the cooling device of the present invention is designed to transfer the heat generated from the main body to the folder to dissipate the heat rapidly, such that the folder type portable wireless terminal can be prevented from overheating and malfunction. Also, the user can operate the folder type portable wireless terminal for a long time without discomfort resulting from overheating.

The foregoing embodiments are merely exemplary and are not to be construed as limiting the present invention. The present teachings can be readily applied to other types of apparatuses. The description of the present invention is intended to be illustrative, and not to limit the scope of the appended claims. Many alternatives, modifications, and variations will be apparent to those skilled in the art.

What is claimed is:

1. A cooling device for a portable wireless terminal including a main body and an openable folder coupled with the main body, the cooling device comprising:
    a cooling plate installed in the folder; and
    a heat transfer element having one end connected to the cooling plate and an other end connected to a mainboard of the main body to transfer heat from the mainboard to the cooling plate, wherein the folder includes a printed circuit board (PCB) on which at least one liquid crystal display (LCD) module is mounted, and the cooling plate is installed on a portion of the PCB where the LCD module is not installed.

2. The cooling device of claim 1, wherein the other end of the heat transfer element is connected in the proximity of at least one heat-generating component of the mainboard.

3. The cooling device of claim 2, wherein the heat transfer element is made of an electrically non-conductive material with a high thermal conductivity.

4. The cooling device of claim 3, wherein the heat transfer element is made of a material selected from the group consisting of silicon rubber and graphite.

5. The cooling device of claim 4, wherein the heat transfer element is coated with an electrically non-conductive film to protect the heat transfer element during opening and closing motions of the folder.

6. The cooling device of claim 1, wherein the cooling plate is larger than the PCB of the folder.

7. The cooling device of claim 6, wherein if the PCB of the folder is mounted with a main LCD module at a front surface and a slave LCD module at a back surface, the cooling plate is attached to the back surface, the cooling plate defining an opening through which the slave LCD module is inserted.

8. The cooling device of claim 7, wherein the cooling plate includes convex portions and concave portions that are alternately arranged on a top surface thereof.

9. The cooling device of claim 1, wherein the cooling plate is made of a material selected from the group consisting of magnesium, silver, gold, copper, aluminum, tungsten, combinations and alloys thereof.

10. The cooling device of claim 2, wherein the cooling plate is made of a material selected from the group consisting of magnesium, silver, gold, copper, aluminum, tungsten, combinations and alloys thereof.

11. The cooling device of claim 3, wherein the cooling plate is made of a material selected from the group consisting of magnesium, silver, gold, copper, aluminum, tungsten, combinations and alloys thereof.

12. The cooling device of claim 4, wherein the cooling plate is made of a material selected from the group consisting of magnesium, silver, gold, copper, aluminum, tungsten, combinations and alloys thereof.

13. The cooling device of claim 5, wherein the cooling plate is made of a material selected from the group consisting of magnesium, silver, gold, copper, aluminum, tungsten, combinations and alloys thereof.

14. The cooling device of claim 1, wherein the cooling plate is made of a material selected from the group consisting of magnesium, silver, gold, copper, aluminum, tungsten, combinations and alloys thereof.

15. The cooling device of claim 6, wherein the cooling plate is made of a material selected from the group consisting of magnesium, silver, gold, copper, aluminum, tungsten, combinations and alloys thereof.

16. The cooling device of claim 7, wherein the cooling plate is made of a material selected from the group consisting of magnesium, silver, gold, copper, aluminum, tungsten, combinations and alloys thereof.

17. The cooling device of claim 8, wherein the cooling plate is made of a material selected from the group consisting of magnesium, silver, gold, copper, aluminum, tungsten, combinations and alloys thereof.

18. A folder type portable wireless terminal provided with a cooling device, comprising:
    a main body in which a mainboard is installed;
    an openable folder coupled with the main body;
    a cooling plate installed in the folder; and
    a heat transfer element having one end connected to the cooling plate and an other end connected to the mainboard to transfer heat from the mainboard to the cooling plate, wherein the folder includes a printed circuit board (PCB) on which at least one liquid crystal display (LCD) module is mounted, and the cooling plate is installed on a portion of the PCB where the LCD module is not installed.

19. A folder type portable wireless terminal comprising:
    a main body having a compartment in which a mainboard is installed;
    an openable folder coupled with the main body;
    a cooling plate installed in the folder; and
    a heat transfer element having one end connected to the cooling plate and another end connected to the mainboard to transfer heat from the compartment of the main body to the cooling plate, wherein the folder includes a printed circuit board (PCB) on which at least one liquid crystal display (LCD) module is mounted, and the cooling plate is installed on a portion of the PCB where the LCD module is not installed.

* * * * *